(12) United States Patent
Han et al.

(10) Patent No.: US 12,306,534 B2
(45) Date of Patent: *May 20, 2025

(54) SEMICONDUCTOR PHOTORESIST COMPOSITION AND METHOD OF FORMING PATTERNS USING THE COMPOSITION

(71) Applicant: Samsung SDI Co., Ltd., Yongin-si (KR)

(72) Inventors: Seung Han, Suwon-si (KR); Jaehyun Kim, Suwon-si (KR); Kyungsoo Moon, Suwon-si (KR); Changsoo Woo, Suwon-si (KR); Seungyong Chae, Suwon-si (KR); Ran Namgung, Suwon-si (KR); Hwansung Cheon, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 522 days.

This patent is subject to a terminal disclaimer.

(21) Appl. No.: 17/306,820

(22) Filed: May 3, 2021

(65) Prior Publication Data

US 2021/0356861 A1 Nov. 18, 2021

(30) Foreign Application Priority Data

May 12, 2020 (KR) ........................ 10-2020-0056720

(51) Int. Cl.
*G03F 7/004* (2006.01)
*C07F 7/22* (2006.01)
*H01L 21/027* (2006.01)

(52) U.S. Cl.
CPC .......... *G03F 7/0042* (2013.01); *C07F 7/2208* (2013.01); *C07F 7/2224* (2013.01); *G03F 7/0043* (2013.01); *G03F 7/0045* (2013.01); *H01L 21/0274* (2013.01)

(58) Field of Classification Search
CPC ..... G03F 7/0042; G03F 7/0043; G03F 7/0044
See application file for complete search history.

(56) References Cited

U.S. PATENT DOCUMENTS

| 2,826,597 | A | 3/1958 | Gloskey |
| 2,832,751 | A | 4/1958 | Weinberg et al. |
| 5,061,599 | A | 10/1991 | Kudo et al. |
| 6,103,448 | A | 8/2000 | Kim et al. |
| 6,514,666 | B1 | 2/2003 | Choi et al. |
| 6,607,867 | B1 | 8/2003 | Kim et al. |
| 7,014,979 | B2 * | 3/2006 | Byun .................. G03F 7/0043 257/E21.174 |
| 2002/0072009 | A1 | 6/2002 | Kim et al. |
| 2004/0191674 | A1 | 9/2004 | Hanamoto et al. |
| 2011/0045406 | A1 | 2/2011 | Keszler et al. |
| 2011/0293888 | A1 | 12/2011 | Stowers et al. |
| 2012/0208127 | A1 | 8/2012 | Hatakeyama |
| 2013/0005150 | A1 | 1/2013 | Ogihara et al. |
| 2013/0224652 | A1 | 8/2013 | Bass et al. |
| 2016/0116839 | A1 | 4/2016 | Meyers et al. |
| 2016/0310944 | A1 | 10/2016 | Nishimura et al. |
| 2017/0052449 | A1 | 2/2017 | Nakagawa et al. |
| 2017/0102612 | A1 | 4/2017 | Meyers et al. |
| 2018/0046086 | A1 | 2/2018 | Waller et al. |
| 2018/0173096 | A1 | 6/2018 | Zi et al. |
| 2019/0033713 | A1 | 1/2019 | Kasahara et al. |
| 2019/0227432 | A1 | 7/2019 | Shiratani |
| 2019/0243243 | A1 | 8/2019 | Naito et al. |
| 2019/0337969 | A1 | 11/2019 | Odedra et al. |
| 2019/0384171 | A1 | 12/2019 | Zi et al. |
| 2020/0041896 | A1 | 2/2020 | Moon et al. |
| 2020/0041897 | A1 | 2/2020 | Moon et al. |
| 2020/0041901 | A1 | 2/2020 | Namgung et al. |
| 2020/0073238 | A1 * | 3/2020 | Zi ............................ G03F 7/039 |
| 2020/0117085 | A1 | 4/2020 | Moon et al. |
| 2021/0311387 | A1 * | 10/2021 | Woo ........................ G03F 7/325 |
| 2021/0356861 | A1 | 11/2021 | Han et al. |
| 2022/0194968 | A1 * | 6/2022 | Moon .................. G03F 7/2004 |

(Continued)

FOREIGN PATENT DOCUMENTS

| CN | 1550894 A | 12/2004 |
| CN | 102269929 A | 12/2011 |
| CN | 108227392 A | 6/2018 |

(Continued)

OTHER PUBLICATIONS

US Notice of Allowance dated Jul. 29, 2022, issued in U.S. Appl. No. 16/859,682 (7 pages).

(Continued)

*Primary Examiner* — John S. Chu (74) *Attorney, Agent, or Firm* — Womble Bond Dickinson (US) LLP (57) ABSTRACT

A semiconductor photoresist composition includes an organometallic compound represented by Chemical Formula 1, an organic acid having a vapor pressure of less than or equal to about 1.0 mmHg at 25° C., and a pKa of about 3 to about 5, and a solvent. A method of forming photoresist patterns utilizes the composition

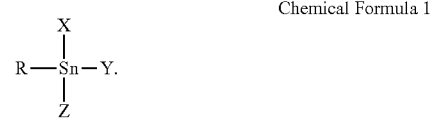

Chemical Formula 1

14 Claims, 3 Drawing Sheets

(56) References Cited

U.S. PATENT DOCUMENTS

2022/0197138 A1* 6/2022 Moon ................ C07F 7/2224

FOREIGN PATENT DOCUMENTS

| | | |
|---|---|---|
| CN | 108351594 A | 7/2018 |
| CN | 110874016 A | 3/2020 |
| CN | 111856879 A | 10/2020 |
| JP | H8-260159 A | 10/1996 |
| JP | 3990146 B2 | 10/2007 |
| JP | 2009-229593 A | 10/2009 |
| JP | 4831324 B2 | 12/2011 |
| JP | 5178858 B2 | 4/2013 |
| JP | 5650086 B2 | 1/2015 |
| JP | 5708521 B2 | 4/2015 |
| JP | 2017-207532 A | 11/2017 |
| JP | 2018-502173 A | 1/2018 |
| JP | 2018-017780 A | 2/2018 |
| JP | 2018-041099 A | 3/2018 |
| JP | 2019-500490 A | 1/2019 |
| JP | 2019-183150 A | 10/2019 |
| JP | 2020-021071 A | 2/2020 |
| JP | 2020-184074 A | 11/2020 |
| KR | 1995-0001702 B1 | 2/1995 |
| KR | 10-0269513 B1 | 10/2000 |
| KR | 2002-0041759 A | 6/2002 |
| KR | 10-0398312 B1 | 9/2003 |
| KR | 10-0386719 B1 | 5/2004 |
| KR | 10-2014-0121826 A | 10/2014 |
| KR | 10-1486533 B1 | 2/2015 |
| KR | 10-2017-0022945 A | 3/2017 |
| KR | 10-2017-0132726 A | 12/2017 |
| KR | 10-2018-0043170 A | 4/2018 |
| KR | 10-2019-0045162 A | 5/2019 |
| KR | 10-2019-0082279 A | 7/2019 |
| KR | 10-2020-0005370 A | 1/2020 |
| KR | 10-2020-0014043 A | 2/2020 |
| KR | 10-2020-0014185 A | 2/2020 |
| KR | 10-2020-0014216 A | 2/2020 |
| KR | 10-2020-0018079 A | 2/2020 |
| KR | 10-2020-0018080 A | 2/2020 |
| TW | 201920214 A | 6/2019 |
| TW | 201924927 A | 7/2019 |
| TW | I669353 B | 8/2019 |
| TW | 202007691 A | 2/2020 |
| TW | I684063 B | 2/2020 |
| TW | I684068 B | 2/2020 |
| WO | WO 2016/140057 A1 | 9/2016 |
| WO | WO 2017-169440 A1 | 10/2017 |
| WO | WO 2018/043506 A1 | 3/2018 |
| WO | WO 2018/046438 A1 | 3/2018 |
| WO | WO 2018/168221 A1 | 9/2018 |
| WO | WO 2018-179704 A1 | 10/2018 |

OTHER PUBLICATIONS

US Notice of Allowance dated Nov. 9, 2022, issued in U.S. Appl. No. 16/859,682 (7 pages).
TW Office Action and Search Report dated Nov. 16, 2021 in corresponding Taiwanese Patent Application No. 110116951, 7 pages.
Notice of Allowance dated Apr. 13, 2022 in U.S. Appl. No. 16/859,682, 8 pages.
Notice of Reason for Rejection for JP Application No. 2021-078454 dated Jun. 7, 2022, 3 pages.
Anderson, Christopher N. et al. "The SEMATECH Berkeley MET: extending EUV learning to 16-nm half pitch." *Proc. SPIE*; vol. 7969; Extreme Ultraviolet (EUV) Lithography II, 7960R (Apr. 5, 2011), pp. 1-6.
Okamoto, Hiroshi et al. "Peroxopolytungstic acids: A new inorganic resist material." *Appl. Phys. Lett.* 49(5), Aug. 4, 1986; pp. 298-300.
Stowers, Jason K. et al. "Directly patterned inorganic hardmask for EUV lithography." *Proc. SPIE*; vol. 7969; Extreme Ultraviolet (EUV) Lithography II, 796915 (Apr. 7, 2011), pp. 1-11.
Japanese Office Action for JP Application No. 2021-056503 dated Mar. 29, 2022, 3 pages.
Taiwanese Office Action for TW Application No. 110111615 dated Apr. 29, 2022, 5 pages.
JPO Office action dated May 25, 2021 issued in corresponding JP Application No. 2020-080534, 4 pages.
Taiwanese Office Action dated Nov. 8, 2021, in Taiwanese Patent Application No. 109114182 and accompanying Search Report (6 pages).
Non-Final Rejection issued in related U.S. Appl. No. 16/859,682, dated Dec. 20, 2021, 12 pages.
Korean Office Action dated May 12, 2023, issued in Korean Patent Application No. 10-2020-0040507 (7 pages).
Korean Office Action dated May 12, 2023, issued in Korean Patent Application No. 10-2020-0056720 (7 pages).
Taiwanese Search Report dated Jun. 25, 2022, for Application No. 110143319, 2 pages.
Japanese Notice of Reasons for Rejection dated Nov. 15, 2022 issued in JP Application No. 2021-183873 (3 pages).
US Office Action dated Mar. 24, 2023, issued in U.S. Appl. No. 17/454,453 (17 pages).
Korean Notice of Allowance dated Dec. 19, 2023, issued in corresponding Korean Patent Application No. 10-2020-0056720 (3 pages).
Sichuan Medical College, English Abstract of "Medicinal Chemistry", Nov. 30, 1979, first edition, People's Medical Publishing House, China.
Xu et al., English Abstract of "Analytical Chemistry", Jun. 30, 1990, first edition, Qingdao Ocean University Press, China.
Chinese Office Action dated Mar. 27, 2024, including Search Report dated Mar. 25, 2024, for corresponding Application No. 202110510318.4, 5 pages.

\* cited by examiner

SEMICONDUCTOR PHOTORESIST COMPOSITION AND METHOD OF FORMING PATTERNS USING THE COMPOSITION

CROSS-REFERENCE TO RELATED APPLICATION

This application claims priority to and the benefit of Korean Patent Application No. 10-2020-0056720, filed in the Korean Intellectual Property Office on May 12, 2020, the entire content of which is incorporated herein by reference.

BACKGROUND

1. Field

One or more aspects of embodiments of the present disclosure relate to a semiconductor photoresist composition and a method of forming patterns utilizing the same.

2. Description of the Related Art

EUV (extreme ultraviolet) lithography is one essential technology for manufacturing next generation semiconductor devices. EUV lithography is a pattern-forming technology utilizing an EUV ray (having a wavelength of about 13.5 nm) as an exposure light source. EUV lithography may be utilized to form an extremely fine pattern (e.g., having an average width of less than or equal to about 20 nm) in an exposure process or task during a manufacture of a semiconductor device.

Extreme ultraviolet (EUV) lithography may be realized through development of compatible photoresists that can be performed at (e.g., applied with) a spatial resolution of less than or equal to about 16 nm. Currently, efforts are being made to overcome the insufficient specifications of chemically amplified (CA) photoresists (including resolution, photospeed, and/or feature roughness), also referred to as a line edge roughness or LER) for next generation devices.

An intrinsic image blurring that occurs due to an acid-catalyzed reaction in polymer-type photoresists (e.g., polymeric chemically amplified (CA) photoresists) limits the resolution of small feature sizes, which has been well known in electron beam (e-beam) lithography for a long time. Chemically amplified (CA) photoresists are designed for high sensitivity, but because their typical compositions have reduced light absorbance at a wavelength of about 13.5 nm, chemically amplified (CA) photoresists may, at least partially, have more difficulties with decreased sensitivity under EUV exposure.

In addition, CA photoresists may have difficulties in (e.g., limitations with respect to) small feature sizes due to roughness issues, and line edge roughness (LER) of the CA photoresists may be experimentally (e.g., empirically) increased, as a photospeed is decreased in part due to acid-catalyzed processes. Accordingly, new high performance photoresists are desired in the semiconductor industry because of these defects and problems of CA photoresists.

Inorganic photoresists based on peroxopolyacids of tungsten mixed with tungsten, niobium, titanium, and/or tantalum have been reported as radiation sensitive materials for patterning, for example in U.S. Pat. No. 5,061,599 and H. Okamoto, T. Iwayanagi, K. Mochiji, H. Umezaki, T. Kudo, Applied Physics Letters, 49 5, 298-300, 1986, the entire content of each of which is incorporated herein by reference.

These materials are effective for patterning large features in a bilayer configuration utilizing far ultraviolet (deep UV), X-ray, and/or electron beam sources. More recently, cationic hafnium metal oxide sulfate ($HfSO_x$) materials along with a peroxo complexing agent have been utilized to image a 15 nm half-pitch (HP) through projection EUV exposure, for example in US 2011-0045406 and J. K. Stowers, A. Telecky, M. Kocsis, B. L. Clark, D. A. Keszler, A. Grenville, C. N. Anderson, P. P. Naulleau, Proc. SPIE, 7969, 796915, 2011, the entire content of each of which is incorporated herein by reference. This system exhibits high or suitable performance of a non-CA photoresist, and has a practicable photospeed near to desired benchmarks for an EUV photoresist. However, the hafnium metal oxide sulfate materials having the peroxo complexing agent have a few practical drawbacks. First, these materials are coated in a mixture of corrosive sulfuric acid/hydrogen peroxide and have insufficient shelf-life stability. Second, structural modifications for performance improvement as a composite mixture are not easy. Third, development is performed in a TMAH (tetramethylammonium hydroxide) solution at an extremely high concentration of about 25 wt % and/or the like.

In order to overcome the aforementioned drawbacks of the chemically amplified (CA) organic photosensitive composition, an inorganic photosensitive composition has been researched. The inorganic photosensitive composition is mainly utilized for negative tone patterning having resistance against removal by a developer composition due to chemical modification through nonchemical amplification mechanism. The inorganic composition contains an inorganic element having a higher EUV absorption rate than hydrocarbon and thus may secure sensitivity through the nonchemical amplification mechanism and in addition, is less sensitive about a stochastic effect and thus suitable to have low line edge roughness and the small number of defects.

In recent years, active research has been conducted as it is suitable that molecules containing tin have excellent or suitable absorption of extreme ultraviolet rays. As for an organic tin polymer among them, alkyl ligands are dissociated by light absorption or secondary electrons produced thereby, and are cross-linked with adjacent chains through oxo bonds and thus enable the negative tone patterning which may not be removed by an organic developing solution. This organic tin polymer exhibits greatly improved sensitivity as well as maintains a resolution and line edge roughness, but the patterning characteristics need to be additionally improved for commercial availability.

SUMMARY

One or more aspects of embodiments of the present disclosure are directed toward a semiconductor photoresist composition having improved resolution, sensitivity, etch resistance, and/or pattern-forming capability.

One or more aspects of embodiments of the present disclosure are directed toward a method of forming a pattern utilizing the semiconductor photoresist composition.

One or more embodiments of the present disclosure provide a semiconductor photoresist composition including: (A) an organometallic compound, (B) an organic acid having a vapor pressure of less than or equal to about 1.0 mmHg at 25° C., and a pKa of about 3 to about 5, and (C) a solvent.

The (B) organic acid may have a vapor pressure of about 0.01 mmHg to about 0.5 mmHg at 25° C., and a pKa of about 3 to about 4.3.

The (B) organic acid may be included in an amount of about 0.1 parts by weight to about 15 parts by weight based on 100 parts by weight of the (A) organometallic compound.

The semiconductor photoresist composition may include about 0.01 wt % to about 2 wt % of the organic acid based on a total mass of the semiconductor photoresist composition. For example, the organic acid may be included in an amount of about 0.01 wt % to about 2 wt % based on the total mass of the semiconductor photoresist composition The (A) organometallic compound may be a compound including tin (Sn).

The (A) organometallic compound may be an organometallic compound represented by Chemical Formula 1:

Chemical Formula 1

In Chemical Formula 1,

R may be a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, or a combination thereof, X, Y, and Z may each independently be $-OR^1$ or $-OC(=O)R^2$, $R^1$ may be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^2$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

The semiconductor photoresist composition may further include an organometallic compound represented by Chemical Formula 2, an organometallic compound represented by Chemical Formula 3, or a combination thereof, in addition to the compound represented by Chemical Formula 1:

Chemical Formula 2

In Chemical Formula 2,

X' may be $-OR^3$ or $-OC(=O)R^4$, $R^3$ may be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^4$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof; and Chemical Formula 3 wherein, in Chemical Formula 3,

X'' may be $-OR^5$ or $-OC(=O)R^6$,

$R^5$ may be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, $R^6$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and

L may be a single bond, a substituted or unsubstituted divalent C1 to C20 saturated aliphatic hydrocarbon group, a substituted or unsubstituted divalent C3 to C20 saturated or unsaturated alicyclic hydrocarbon group, a substituted or unsubstituted divalent C2 to C20 unsaturated aliphatic hydrocarbon group including at least one double bond or triple bond, a substituted or unsubstituted divalent C6 to C20 aromatic hydrocarbon group, $-O-$, $-C(=O)-$, or a combination thereof.

A sum of the amount of the compound represented by Chemical Formula 2 and the amount of the compound represented by Chemical Formula 3 with respect to the amount of the organometallic compound represented by Chemical Formula 1 may be in a weight ratio of about 1:1 to about 1:20.

The compound represented by Chemical Formula 1 may include a compound represented by Chemical Formula 4, a compound represented by Chemical Formula 5, a compound represented by Chemical Formula 6, a compound represented by Chemical Formula 7, or a combination thereof:

Chemical Formula 4

Chemical Formula 5

Chemical Formula 6

Chemical Formula 7

In Chemical Formula 4 to Chemical Formula 7, $R^a$, $R^b$, $R^c$, $R^i$, $R^k$, and $R^l$ may each independently be the same as $R^1$, and $R^d$, $R^e$, $R^f$, $R^g$, $R^h$, and $R^j$ may each independently be the same as $R^2$.

The semiconductor photoresist composition may further include an additive including a surfactant, a cross-linking agent, a leveling agent, a quencher, or a combination thereof.

One or more embodiments of the present disclosure provide a method of forming patterns including: forming an etching-objective layer on a substrate, coating the semiconductor photoresist composition on the etching-objective layer to form a photoresist layer, patterning the photoresist layer to form a photoresist pattern, and etching the etching-objective layer utilizing the photoresist pattern as an etching mask.

The photoresist pattern may be formed utilizing light having a wavelength of about 5 nm to about 150 nm.

The method of forming patterns may further include providing a resist underlayer formed between the substrate and the photoresist layer. For example, the method of forming patterns may further include forming a resist underlayer over the substrate, prior to the coating of the semiconductor photoresist composition on the etching-objective layer. In some embodiments, the resist underlayer may be formed directly on the substrate (e.g., prior to the forming of the etching-objective layer), and in some embodiments the resist underlayer may be formed on the etching-objective layer (e.g., after the forming of the etching-objective layer).

The photoresist pattern may have a width of about 5 nm to about 100 nm.

The semiconductor photoresist composition according to an embodiment may have relatively improved etch resistance, sensitivity, resolution, and/or pattern-forming capability and thus may provide a photoresist pattern having improved sensitivity and/or a high aspect ratio without a pattern collapse.

DETAILED DESCRIPTION

Hereinafter, embodiments of the present disclosure will be described in more detail while referring to the drawings.

In the following description of the present disclosure, well-known functions or constructions will not be described in order to focus on the present disclosure.

In the drawings, the same or similar configuration elements may be designated by the same reference numerals, and duplicative descriptions thereof may not be provided. Also, because the sizes and thicknesses of configurations shown in the drawing are arbitrarily shown for better understanding and ease of description, the present disclosure is not necessarily limited thereto.

In the drawings, thicknesses and dimensions may be enlarged in order to clearly indicate various layers and regions. For example, such elements may be exaggerated for clarity. It will be understood that when an element such as a layer, film, region, or substrate is referred to as being "on" another element, it can be directly on the other element, or intervening elements may also be present. When an element is referred to as being "directly on," another element, there are no intervening elements present.

As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively. As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items. Further, the use of "may" when describing embodiments of the present disclosure refers to "one or more embodiments of the present disclosure".

As utilized herein, "substituted" refers to replacement of a hydrogen atom by deuterium, a halogen, a hydroxy group, a cyano group, a nitro group, —NRR' (wherein, R and R' are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), —SiRR'R" (wherein, R, R', and R" are independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), a C1 to C30 alkyl group, a C1 to C10 haloalkyl group, a C1 to C10 alkylsilyl group, a C3 to C30 cycloalkyl group, a C6 to C30 aryl group, a C1 to C20 alkoxy group, or a combination thereof. "Unsubstituted" refers to non-replacement (e.g., no replacement, a lack of replacement) of a hydrogen atom by another substituent, such that the hydrogen atom is maintained.

As utilized herein, when a definition is not otherwise provided, "an alkyl group" refers to a linear or branched aliphatic hydrocarbon group. The alkyl group may be "a saturated alkyl group" without any double bond or triple bond.

The alkyl group may be a C1 to C8 alkyl group. For example, the alkyl group may be a C1 to C7 alkyl group, a C1 to C6 alkyl group, a C1 to C5 alkyl group, or a C1 to C4 alkyl group. For example, the C1 to C4 alkyl group may be a methyl group, an ethyl group, a propyl group, an isopropyl group, an n-butyl group, an isobutyl group, a sec-butyl group, a tert-butyl group, or a 2,2-dimethylpropyl group.

As utilized herein, when a definition is not otherwise provided, "cycloalkyl group" refers to a monovalent cyclic aliphatic hydrocarbon group.

The cycloalkyl group may be a C3 to C8 cycloalkyl group, for example, a C3 to C7 cycloalkyl group, a C3 to C6 cycloalkyl group, a C3 to C5 cycloalkyl group, or a C3 to C4 cycloalkyl group. For example, the cycloalkyl group may be a cyclopropyl group, a cyclobutyl group, a cyclopentyl group, or a cyclohexyl group, but is not limited thereto.

As utilized herein, "an aliphatic unsaturated organic group" refers to a hydrocarbon group including one or more double bonds and/or triple bonds.

The aliphatic unsaturated organic group may be a C2 to C8 aliphatic unsaturated organic group. For example, the aliphatic unsaturated organic group may be a C2 to C7 aliphatic unsaturated organic group, a C2 to C6 aliphatic unsaturated organic group, a C2 to C5 aliphatic unsaturated organic group, or a C2 to C4 aliphatic unsaturated organic group. For example, the C2 to C4 aliphatic unsaturated organic group may be a vinyl group, an ethynyl group, an allyl group, a 1-propenyl group, a 1-methyl-1-propenyl group, a 2-propenyl group, a 2-methyl-2-propenyl group, a 1-propynyl group, a 1-methyl-1 propynyl group, a 2-propynyl group, a 2-methyl-2-propynyl group, a 1-butenyl group, a 2-butenyl group, a 3-butenyl group, a 1-butynyl group, a 2-butynyl group, or a 3-butynyl group.

As utilized herein, "aryl group" refers to a substituent in which all atoms in the cyclic substituent have a p-orbital (e.g., a p-orbital oriented normal to a plane containing the atoms of the substituents) and these p-orbitals are conjugated (e.g., the p-orbitals form an electronically conjugated system) and may include a monocyclic or fused ring polycyclic functional group (i.e., rings sharing adjacent pairs of carbon atoms) functional group.

As utilized herein, unless otherwise defined, "alkenyl group" refers to an aliphatic unsaturated alkenyl group including at least one double bond as a linear or branched aliphatic hydrocarbon group.

As utilized herein, unless otherwise defined, "alkynyl group" refers to an aliphatic unsaturated alkynyl group including at least one triple bond as a linear or branched aliphatic hydrocarbon group.

Hereinafter, a semiconductor photoresist composition according to an embodiment is described.

The semiconductor photoresist composition according to an embodiment of the present disclosure includes (A) an organometallic compound, (B) an organic acid having a vapor pressure of less than or equal to about 1.0 mmHg at 25° C., and a pKa of about 3 to about 5, and (C) a solvent.

In some embodiments, the (A) organometallic compound may include tin (Sn), and specifically, the (A) organometallic compound may be represented by Chemical Formula 1.

Chemical Formula 1

In Chemical Formula 1,

R may be a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, or a combination thereof, X, Y, and Z may each independently be —$OR^1$ or —OC(=O)$R^2$, $R^1$ may be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^2$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

The organometallic compound represented by Chemical Formula 1 may have a structure in which a tin atom is substituted with one R group and three —$OR^1$ or —OC(=O)$R^2$.

The compound represented by Chemical Formula 1 may be an organotin compound, in which the tin atom may intensively absorb extreme ultraviolet (EUV) light at 13.5 nm and thus have excellent or suitable sensitivity to such EUV light, R of Chemical Formula 1 may impart photosensitivity to the compound, and the Sn—R bond formed therebetween may promote suitable solubility in an organic solvent to the organotin compound.

When the organic tin copolymer having structural units represented by Chemical Formula 1 (e.g., as formed through copolymerization of the organometallic compound) is exposed to extreme ultraviolet, the R functional group of Chemical Formula 1 may be dissociated from the Sn—R bond to form a radical, and this radical may form an additional (e.g., new) —Sn—O—Sn— bond in a condensation polymerization reaction between organic tin copolymers, thereby contributing to forming a semiconductor photoresist from the composition according to an embodiment.

In the organometallic compound represented by Chemical Formula 1, the substituent represented by R may be a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, or a combination thereof.

The organometallic compound represented by Chemical Formula 1 may further include three organic ligands X, Y, and Z, which may each be hydrolyzed to form Sn—O bonds. To form Sn—O—Sn bonds between organotin compounds, the X, Y, and Z ligands may be heat treated under an acidic or basic catalyst, or hydrolyzed and dehydrated with no heat treatment (e.g., without using increased heat or elevated temperatures), whereby an organotin copolymer including the organometallic compound represented by Chemical Formula 1 is formed.

In some embodiments, X, Y, and Z determine a solubility of the organometallic compound represented by Chemical Formula 1 in a solvent.

The semiconductor photoresist composition according to an embodiment of the present disclosure additionally includes an organic acid in addition to the organometallic compound represented by Chemical Formula 1 and the solvent, wherein the organic acid has a vapor pressure of less than or equal to about 1.0 mmHg at 25° C. When the semiconductor photoresist composition includes an organic acid that satisfies the vapor pressure and pKa conditions, it is possible to improve pattern formation characteristics such as resolution, sensitivity, and line edge roughness (LER) characteristics of the semiconductor photoresist composition.

The organic acid may have a vapor pressure of less than or equal to about 1.0 mmHg at 25° C., for example, less than or equal to about 0.9 mmHg, less than or equal to about 0.8 mmHg, less than or equal to about 0.7 mmHg, less than or equal to about 0.6 mmHg, less than or equal to about 0.5 mmHg, less than or equal to about 0.4 mmHg, less than or equal to about 0.3 mmHg, less than or equal to about 0.2 mmHg, less than or equal to about 0.1 mmHg, less than or equal to about 0.09 mmHg, less than or equal to about 0.08 mmHg, less than or equal to about 0.07 mmHg, less than or equal to about 0.06 mmHg, less than or equal to about 0.05 mmHg, less than or equal to about 0.04 mmHg, less than or equal to about 0.03 mmHg, less than or equal to about 0.02 mmHg, or less than or equal to about 0.01 mmHg, but is not limited thereto. When the organic acid has a vapor pressure of greater than about 1.0 mmHg at about 25° C., the organic acid is easily evaporated on a wafer, while the semiconductor photoresist composition is coated on the wafer, failing in achieving an effect of improving pattern formation characteristics of the semiconductor photoresist composition such as resolution, sensitivity, and line edge roughness (LER) characteristics, and the like.

The pKa is obtained by taking a minus log (–log) to an acid dissociation constant Ka, when the acid (HA) is dissociated into $H^+$ and $A^-$ in an aqueous solution, wherein the larger the pKa is, the weaker the acid is. The organic acid included in the semiconductor photoresist composition according to an embodiment of the present disclosure may have a pKa of about 3 to about 5, for example, about 3 to about 4.9, about 3 to about 4.8, about 3 to about 4.7, about 3 to about 4.6, about 3 to about 4.5, about 3 to about 4.4, about 3 to about 4.3, about 3 to about 4.2, about 3 to about 4.1, or, about 3 to about 4. When two or more acid-dissociating functional groups exist (e.g., are present) in one organic acid molecule, a pKa (e.g., a first pKa) of the molecule is determined by the functional group having the lowest pKa. When the semiconductor photoresist composition further includes organic acid with a pKa of about 3 to about 5, the resolution, sensitivity, and line edge roughness (LER) characteristics may be more improved, compared with when the semiconductor photoresist composition includes organic acid with a pKa of less than about 3 or greater than about 5 or no organic acid.

The organic acid may include two or more different types (kinds) of organic acids concurrently (e.g., simultaneously).

The organic acid may be or include, for example, citric acid, glycolic acid, lactic acid, succinic acid, etc., but is not limited thereto.

The (B) organic acid may be included in an amount of greater than or equal to about 0.1 parts by weight, greater than or equal to about 0.2 parts by weight, greater than or equal to about 0.3 parts by weight, greater than or equal to about 0.4 parts by weight, greater than or equal to about 0.5 parts by weight, greater than or equal to about 0.6 parts by weight, greater than or equal to about 0.7 parts by weight, greater than or equal to about 0.8 parts by weight, greater than or equal to about 0.9 parts by weight, or greater than or equal to about or 1.0 parts by weight, and less than or equal to 15 parts by weight, less than or equal to about 14 parts by weight, less than or equal to about 13 parts by weight, less than or equal to about 12 parts by weight, less than or equal to about 11 parts by weight, or less than or equal to about 10 parts by weight based on 100 parts by weight of the (A) organometallic compound. When the organic acid is included in the semiconductor photoresist composition in the above content range, resolution, sensitivity, and/or line edge roughness (LER) characteristics may be concurrently (e.g., simultaneously) improved.

The semiconductor photoresist composition may include the organic acid in an amount of about 0.01 wt % to about 2 wt %, for example, about 0.01 wt % to about 1.9 wt %, about 0.01 wt % to about 1.8 wt %, about 0.01 wt % to about 1.7 wt %, about 0.01 wt % to about 1.6 wt %, about 0.01 wt % to about 1.5 wt %, about 0.01 wt % to about 1.4 wt %, about 0.01 wt % to about 1.3 wt %, about 0.01 wt % to about 1.2 wt %, about 0.01 wt % to about 1.1 wt %, about 0.01 wt % to about 1.0 wt %, about 0.01 wt % to about 0.9 wt %, about 0.01 wt % to about 0.8 wt %, about 0.01 wt % to about 0.7 wt %, about 0.01 wt % to about 0.6 wt %, about 0.01 wt % to about 0.5 wt %, about 0.01 wt % to about 0.4 wt %, about 0.01 wt % to about 0.3 wt %, about 0.01 wt % to about 0.2 wt %, or about 0.01 wt % to about 0.1 wt % based on a total mass of the semiconductor photoresist composition. When the organic acid is included in an amount of less than about 0.01 wt %, the pattern-forming capability of the semiconductor photoresist composition is not improved sufficiently, while when the organic acid is included in an amount exceeding 2 wt %, development may not occur due to excessive thermal reaction.

The semiconductor photoresist composition according to an embodiment may further include an organometallic compound represented by Chemical Formula 2, an organometallic compound represented by Chemical Formula 3, or a combination thereof in addition to the compound represented by Chemical Formula 1:

Chemical Formula 2

In Chemical Formula 2,

X' may be $-OR^3$ or $-OC(=O)R^4$, $R^3$ may be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^4$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof; and Chemical Formula 3 wherein, in Chemical Formula 3,

X″ may be —OR$^5$ or —OC(═O)R$^6$,

R$^5$ may be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, R$^6$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and L may be a single bond, a substituted or unsubstituted divalent C1 to C20 saturated aliphatic hydrocarbon group, a substituted or unsubstituted divalent C3 to C20 saturated or unsaturated alicyclic hydrocarbon group, a substituted or unsubstituted divalent C2 to C20 unsaturated aliphatic hydrocarbon group including at least one double bond or triple bond, a substituted or unsubstituted divalent C6 to C20 aromatic hydrocarbon group, —O—, —C(═O)—, or a combination thereof.

The semiconductor photoresist composition according to an embodiment of the present disclosure concurrently (e.g., simultaneously) includes (e.g., as a mixture) the organometallic compound, the organic acid, and the organometallic compound represented by Chemical Formula 2 and/or the organometallic compound represented by Chemical Formula 3, and thus a semiconductor photoresist composition having excellent or suitable sensitivity and/or pattern formability may be provided.

By appropriately or suitably adjusting a ratio (e.g., amount, for example, total amount) of the organometallic compound represented by Chemical Formula 2 and/or the organometallic compound represented by Chemical Formula 3 included in the organometallic copolymer, a degree of dissociation of the ligand represented by R from the copolymer may be controlled or selected, and accordingly, a semiconductor photoresist having excellent or suitable sensitivity, low line edge roughness, and/or excellent or suitable resolution may be provided, while controlling a degree of cross-linking through oxo bonding with surrounding chains by radicals generated as the ligand is dissociated. For example, a semiconductor photoresist having excellent or suitable sensitivity, line edge roughness, and/or resolution may be provided by concurrently (e.g., simultaneously) including the organometallic compound represented by Chemical Formula 1 and the organometallic compound represented by Chemical Formula 2 or the organometallic compound represented by Chemical Formula 3.

The sum of the amount of the compound represented by Chemical Formula 2 and the amount of the compound represented by Chemical Formula 3 with respect to the amount of the organometallic compound represented by Chemical Formula 1 may be in a weight ratio of about 1:1 to about 1:20, for example, about 1:1 to about 1:19, for example, about 1:1 to about 1:18, for example, about 1:1 to about 1:17, for example, about 1:1 to about 1:16, for example, about 1:1 to about 1:15, for example, about 1:1 to about 1:14, for example, about 1:1 to about 1:13, for example, about 1:1 to about 1:12, for example, about 1:1 to about 1:11, for example, about 1:1 to about 1:10, for example, about 1:1 to about 1:9, for example, about 1:1 to about 1:8, for example, about 1:1 to about 1:7, for example, about 1:1 to about 1:6, for example, about 1:1 to about 1:5, for example, about 1:1 to about 1:4, for example, about 1:1 to about 1:3, or for example, about 1:1 to about 1:2, but the present disclosure is not limited thereto. When the weight ratio of the compound represented by Chemical Formula 2 and/or the organometallic compound represented by Chemical Formula 3 with respect to the organometallic compound represented by Chemical Formula 1 satisfies the above ranges, a semiconductor photoresist composition having excellent or suitable sensitivity and/or resolution may be provided.

R of the compound represented by Chemical Formula 1 may be, for example, a substituted or unsubstituted C1 to C8 alkyl group, a substituted or unsubstituted C3 to C8 cycloalkyl group, a substituted or unsubstituted C2 to C8 aliphatic unsaturated organic group including at least one double bond or triple bond, a substituted or unsubstituted C6 to C20 aryl group, an ethoxy group, a propoxy group, or a combination thereof, for example, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, an ethoxy group, a propoxy group, or a combination thereof.

R$^1$ of the compound represented by Chemical Formula 1 may be a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof, for example, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof.

R$^2$ of the compound represented by Chemical Formula 1 may be hydrogen, a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof, for example, hydrogen, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof.

The compound represented by Chemical Formula 1 may include a compound represented by Chemical Formula 4, a compound represented by Chemical Formula 5, a compound represented by Chemical Formula 6, a compound represented by Chemical Formula 7, or a combination thereof:

Chemical Formula 4

Chemical Formula 5

Chemical Formula 6

Chemical Formula 7

In Chemical Formula 4 to Chemical Formula 7, $R^a$, $R^b$, $R^c$, $R^i$, $R^k$, and $R^l$ may each independently be the same as the definition for $R^1$, and

$R^d$, $R^e$, $R^f$, $R^g$, $R^h$, and $R^j$ may each independently be the same as the definition for $R^2$.

The solvent included in the semiconductor photoresist composition according to an embodiment may be an organic solvent. The solvent may be, for example, an aromatic compound solvent (e.g., xylene, toluene, etc.), an alcohol (e.g., 4-methyl-2-pentanol, 4-methyl-2-propanol, 1-butanol, methanol, isopropyl alcohol, 1-propanol, propylene glycol monomethyl ether), an ether (e.g., anisole, tetrahydrofuran), an ester (n-butyl acetate, propylene glycol monomethyl ether acetate, an ethyl acetate, an ethyl lactate), a ketone (e.g., methyl ethyl ketone, 2-heptanone), or a mixture thereof, but is not limited thereto.

In an embodiment, the semiconductor photoresist composition may further include a resin in addition to the aforementioned organometallic compound and solvent.

The resin may be a phenol-based resin including at least one aromatic moiety of Group 1:

Group 1

The resin may have a weight average molecular weight of about 500 to about 20,000.

The resin may be included in an amount of about 0.1 wt % to about 50 wt % based on a total amount of the semiconductor photoresist composition.

When the resin is included within the amount range, it may have excellent or suitable etch resistance and/or heat resistance.

The semiconductor photoresist composition according to an embodiment may be desirably or sufficiently composed of the organometallic compound, the solvent, and the resin. In some embodiments, the semiconductor photoresist composition according to the above embodiment may further include an additive (e.g., as desired). Examples of the additive may include a surfactant, a cross-linking agent, a leveling agent, a quencher, and a combination thereof.

The surfactant may include, for example, an alkyl benzene sulfonate salt, an alkyl pyridinium salt, polyethylene glycol, a quaternary ammonium salt, or a combination thereof, but is not limited thereto.

The cross-linking agent may be, for example, a melamine-based cross-linking agent, a substituted urea-based cross-linking agent, an acryl-based cross-linking agent, an epoxy-based cross-linking agent, or a polymer-based cross-linking agent, but is not limited thereto. In some embodiments, the cross-linking agent may have at least two cross-linking forming substituents, and for example, may be methoxymethylated glycoluril, butoxymethylated glycoluril, methoxymethylated melamine, butoxymethylated melamine, methoxymethylated benzoguanamine, butoxymethylated benzoguanamine, 4-hydroxybutyl acrylate, acrylic acid, urethane acrylate, acryl methacrylate, 1,4-butanediol diglycidyl ether, glycidol, diglycidyl 1,2-cyclohexane dicarboxylate, trimethylolpropane triglycidyl ether, 1,3-bis(glycidoxypropyl)tetramethyldisiloxane, methoxymethylated urea, butoxymethylated urea, or methoxymethylated thiourea, and/or the like.

The leveling agent may be utilized for improving coating flatness during printing, and may be any suitable commercially available leveling agent.

The quencher may be tri-p-tolylamine, methyl diphenyl amine, triphenyl amine, phenylenediamine, naphthylamine, diaminonaphthalene, or a combination thereof.

The amount of the additive (e.g., each additive) may be controlled or selected depending on desired or suitable properties or performance.

In some embodiments, the semiconductor photoresist composition may further include a silane coupling agent as an adherence enhancer in order to improve a close-contacting force with the substrate (e.g., in order to improve adherence of the semiconductor photoresist composition to the substrate). The silane coupling agent may be, for example, a silane compound including a carbon-carbon unsaturated bond (such as vinyl trimethoxysilane, vinyl triethoxysilane, vinyl trichlorosilane, vinyl tris(β-methoxyethoxy)silane; or 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane; trimethoxy[3-(phenylamino)propyl]silane, and/or the like), but is not limited thereto.

The semiconductor photoresist composition may be formed into a pattern having a high aspect ratio without a collapse. Accordingly, in order to form a fine pattern having a width of, for example, about 5 nm to about 100 nm, about 5 nm to about 80 nm, about 5 nm to about 70 nm, about 5 nm to about 50 nm, about 5 nm to about 40 nm, about 5 nm to about 30 nm, or about 5 nm to about 20 nm, the semiconductor photoresist composition may be utilized for a photoresist process utilizing light in a wavelength of about 5 nm to about 150 nm, for example, about 5 nm to about 100 nm, about 5 nm to about 80 nm, about 5 nm to about 50 nm, about 5 nm to about 30 nm, or about 5 nm to about 20 nm. Accordingly, the semiconductor photoresist composition according to an embodiment may be utilized to realize extreme ultraviolet lithography utilizing an EUV light source of a wavelength of about 13.5 nm.

According to another embodiment, a method of forming patterns utilizing the aforementioned semiconductor photoresist composition is provided. For example, the manufactured pattern may be a photoresist pattern.

The method of forming patterns according to an embodiment includes: forming an etching-objective layer on a substrate, coating the semiconductor photoresist composition on the etching-objective layer to form a photoresist layer, patterning the photoresist layer to form a photoresist pattern, and etching the etching-objective layer utilizing the photoresist pattern as an etching mask.

Hereinafter, a method of forming patterns utilizing the semiconductor photoresist composition is described referring to FIGS. 1 to 5. FIGS. 1 to 5 are cross-sectional views for explaining a method of forming patterns utilizing a semiconductor photoresist composition according to an embodiment.

Figure 1:
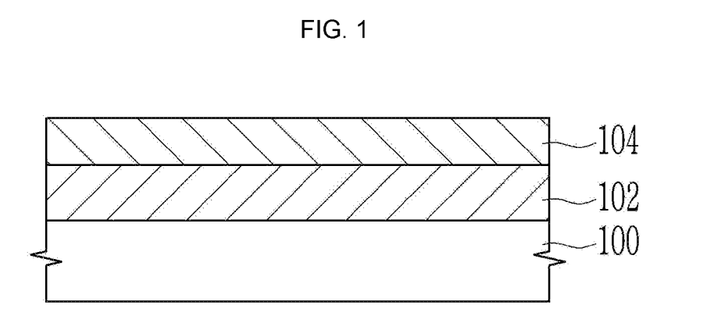
FIGS. 1-5 are cross-sectional views for explaining a method of forming patterns utilizing a semiconductor photoresist composition according to an embodiment.

Referring to FIG. 1, an object for etching is prepared. The object for etching may be a thin film 102 formed on a semiconductor substrate 100. Hereinafter, the object for etching is limited to (e.g., includes only) the thin film 102. A whole surface (e.g., the entire upper surface) of the thin film 102 may be washed to remove impurities and/or the like remaining thereon. The thin film 102 may be, for example, a silicon nitride layer, a polysilicon layer, and/or a silicon oxide layer.

Subsequently, the resist underlayer composition for forming a resist underlayer 104 is spin-coated on the surface of the washed thin film 102. However, embodiments are not limited thereto, and one or more suitable coating methods, for example a spray coating, a dip coating, a knife edge coating, a printing method, (e.g., inkjet printing and screen printing), and/or the like may be utilized.

The coating process of the resist underlayer may be the same as understood in the related art.

Then, the coated composition is dried and baked to form a resist underlayer 104 on the thin film 102. The baking may be performed at a temperature of about 100° C. to about 500° C., for example, about 100° C. to about 300° C.

The resist underlayer 104 is formed between the substrate 100 and a photoresist layer 106, and may prevent or reduce non-uniformity, as well as decrease the probability of photoresist line pattern formation when a ray reflected from the interface between the substrate 100 and the photoresist layer 106, or from a hardmask between layers, is unintentionally scattered onto the photoresist (e.g., in a region that is not intended to be exposed).

Figure 2:
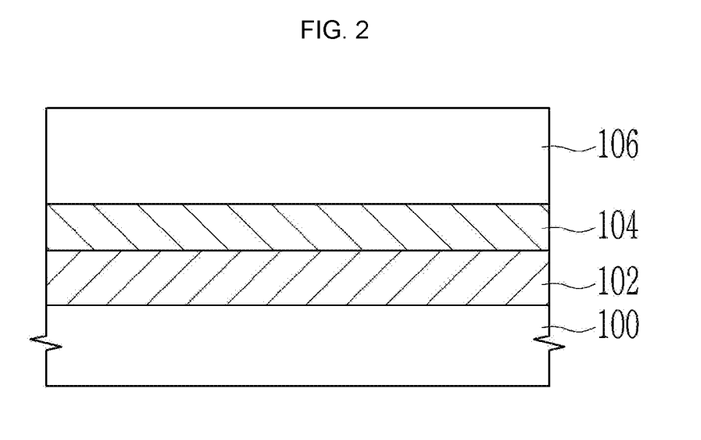

Referring to FIG. 2, the photoresist layer 106 is formed by coating the semiconductor photoresist composition on the resist underlayer 104. The photoresist layer 106 is obtained by coating the aforementioned semiconductor photoresist composition on the thin film 102 formed on the substrate 100, and then curing it (e.g., the coated semiconductor photoresist composition) through a heat treatment.

For example, the formation of a pattern by utilizing the semiconductor photoresist composition may include coating the semiconductor photoresist composition on the substrate 100 having the thin film 102 through spin coating, slit coating, inkjet printing, and/or the like, and then drying it to form the photoresist layer 106.

The semiconductor photoresist composition has already been illustrated in detail, and will not be illustrated again.

Subsequently, a substrate 100 having the photoresist layer 106 thereon is subjected to a first baking process. The first baking process may be performed at a temperature of about 80° C. to about 120° C.

Figure 3:
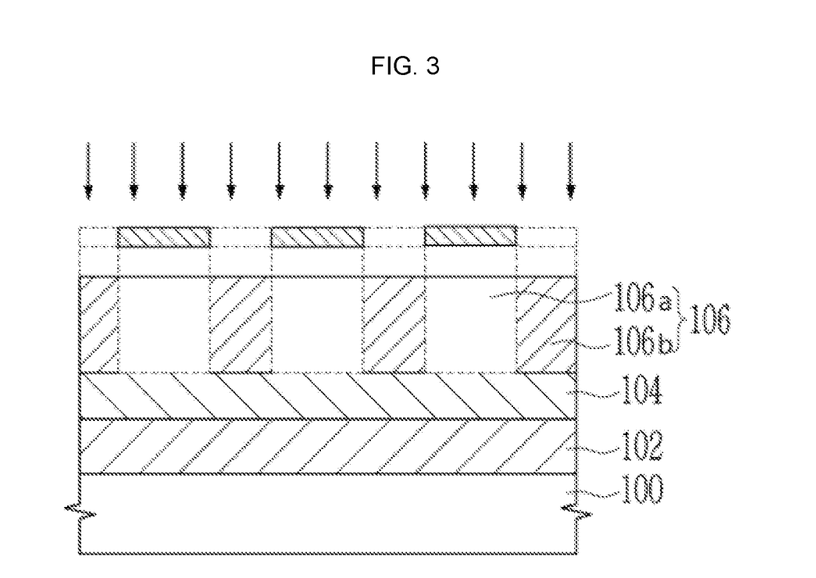

Referring to FIG. 3, the photoresist layer 106 may be selectively exposed.

For example, the exposure may utilize activated radiation with light having a high energy wavelength (such as EUV (having a wavelength of about 13.5 nm), an E-Beam (an electron beam), and/or the like), as well as a short wavelength (such as an i-line (having a wavelength of about 365 nm), a KrF excimer laser (having a wavelength of about 248 nm), an ArF excimer laser (having a wavelength of about 193 nm), and/or the like).

For example, light for the exposure according to an embodiment may have a short wavelength of about 5 nm to about 150 nm and a high energy wavelength, for example, EUV (having a wavelength of about 13.5 nm), an E-Beam (an electron beam), and/or the like.

The exposed region 106b of the photoresist layer 106 has a different solubility from the non-exposed region 106a of the photoresist layer 106, due to forming a polymer by a cross-linking reaction (such as condensation) between organometallic compounds.

Subsequently, the substrate 100 is subjected to a second baking process. The second baking process may be performed at a temperature of about 90° C. to about 200° C. The exposed region 106b of the photoresist layer 106 becomes substantially insoluble or poorly soluble in a developing solution due to (e.g., as a result of) the second baking process.

Figure 4:
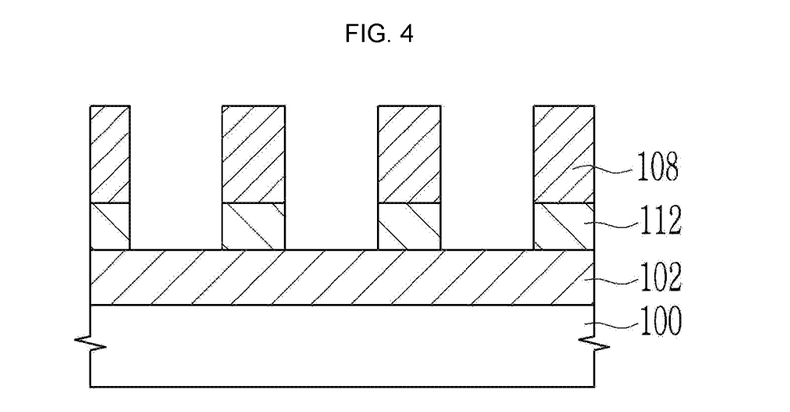

In FIG. 4, the non-exposed region 106a of the photoresist layer is dissolved and removed utilizing the developing solution to form a photoresist pattern 108. For example, the non-exposed region 106a of the photoresist layer is dissolved and removed by utilizing an organic solvent (such as 2-heptanone and/or the like) to complete the photoresist pattern 108 corresponding to the negative tone image.

As described above, a developing solution utilized in a method of forming patterns according to an embodiment may be an organic solvent. The organic solvent utilized in the method of forming patterns according to an embodiment may be, for example, a ketone (such as methylethylketone, acetone, cyclohexanone, 2-heptanone, and/or the like), an alcohol (such as 4-methyl-2-propanol, 1-butanol, isopropanol, 1-propanol, methanol, and/or the like), an ester (such as propylene glycol monomethyl ether acetate, ethyl acetate, ethyl lactate, n-butyl acetate, butyrolactone, and/or the like), an aromatic compound (such as benzene, xylene, toluene, and/or the like), or a combination thereof.

However, the photoresist pattern according to an embodiment is not necessarily limited to the negative tone image, and in some embodiments may be formed to have a positive tone image. For example, a developing agent utilized for forming the positive tone image may be a quaternary ammonium hydroxide composition (such as tetraethylammonium hydroxide, tetrapropylammonium hydroxide, tetrabutylammonium hydroxide, or a combination thereof).

As described above, exposure to light having a high energy (such as EUV (having a wavelength of about 13.5 nm), an E-Beam (an electron beam), and/or the like) as well as light having a short wavelength (such as i-line (having a wavelength of about 365 nm), KrF excimer laser (having a wavelength of about 248 nm), ArF excimer laser (having a wavelength of about 193 nm), and/or the like) may provide a photoresist pattern 108 having a width of a thickness of about 5 nm to about 100 nm. For example, the photoresist pattern 108 may have a width (e.g., thickness) of about 5 nm to about 90 nm, about 5 nm to about 80 nm, about 5 nm to about 70 nm, about 5 nm to about 60 nm, about 10 nm to about 50 nm, about 10 nm to about 40 nm, about 10 nm to about 30 nm, or about 10 nm to about 20 nm.

In some embodiments, the photoresist pattern 108 may have a half-pitch of less than or equal to about 50 nm, for example less than or equal to about 40 nm, less than or equal to about 30 nm, or less than or equal to about 25 nm, and a line width roughness of less than or equal to about 10 nm, or less than or equal to about 5 nm.

Subsequently, the photoresist pattern 108 is utilized as an etching mask to etch the resist underlayer 104. Through this etching process, an organic layer pattern 112 is formed. The organic layer pattern 112 may have a width corresponding to (e.g., matching) that of the photoresist pattern 108.

Figure 5:
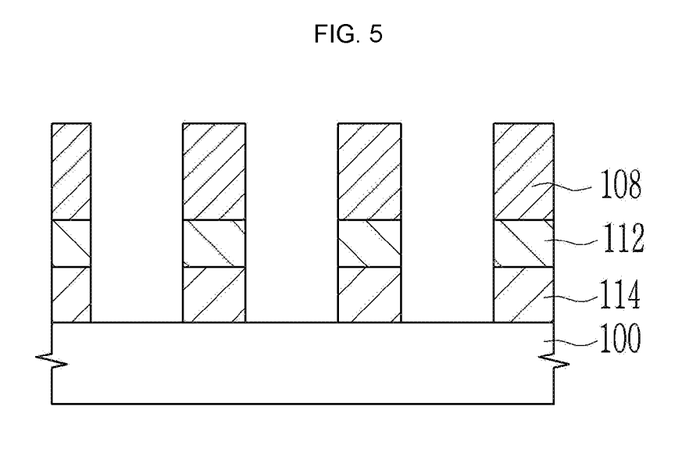

Referring to FIG. 5, the photoresist pattern 108 is applied as an etching mask to etch the exposed thin film 102. As a result, the thin film is formed with (e.g., processed to) a thin film pattern 114.

The etching of the thin film 102 may be, for example, dry etching utilizing an etching gas, and the etching gas may be, for example, $CHF_3$, $CF_4$, $Cl_2$, $BCl_3$, or a mixed gas thereof.

In the exposure process, the thin film pattern 114 formed by utilizing the photoresist pattern 108, which is formed through the exposure process performed by utilizing an EUV light source, may have a width corresponding to (e.g., matching) that of the photoresist pattern 108. For example, the thin film pattern 114 may have a width of about 5 nm to about 100 nm, substantially equal to that of the photoresist pattern 108. For example, the thin film pattern 114 formed by utilizing the photoresist pattern 108 formed through the exposure process performed by utilizing an EUV light source may have a width of about 5 nm to about 90 nm, about 5 nm to about 80 nm, about 5 nm to about 70 nm, about 5 nm to about 60 nm, about 10 nm to about 50 nm, about 10 nm to about 40 nm, about 10 nm to about 30 nm, or about 10 nm to about 20 nm, and for example, less than or equal to about 20 nm, like that of the photoresist pattern 108.

Hereinafter, the present disclosure will be described in more detail through examples of the preparation of the aforementioned semiconductor photoresist composition. However, the present disclosure is not restricted by the following examples.

EXAMPLES

Synthesis Example 1

20 g (51.9 mmol) of $Ph_3SnCl$ was dissolved in 70 mL of THF in a 250 mL 2-necked and round-bottomed flask and then, cooled down to 0° C. in an ice bath. Subsequently, a 1 M butyl magnesium chloride (BuMgCl) THF solution (62.3 mmol) was slowly added thereto in a dropwise fashion. When the addition in a dropwise fashion was complete, the obtained mixture was stirred at 25° C. for 12 hours to obtain a compound represented by Chemical Formula 8a.

Chemical Formula 8a

Chemical Formula 9a

Then, the compound represented by Chemical Formula 8a (10 g, 24.6 mmol) was dissolved in 50 mL of $CH_2Cl_2$, and 3 equivalents (73.7 mmol) of a 2 M HCl diethyl ether solution were slowly added thereto in a dropwise fashion at −78° C. for 30 minutes. Subsequently, the obtained mixture was stirred at 25° C. for 12 hours, and then, a compound represented by Chemical Formula 8b is obtained by concentrating the solvent and performing vacuum distillation.

Then, the compound represented by Chemical Formula 9a (10 g, 24.6 mmol) was dissolved in 50 mL of $CH_2Cl_2$, and 3 equivalents (73.7 mmol) of a 2 M HCl diethyl ether solution were slowly added thereto in a dropwise fashion at −78° C. for 30 minutes. Subsequently, the obtained mixture was stirred at 25° C. for 12 hours, and then, a compound represented by Chemical Formula 9b was obtained by concentrating the solvent and performing vacuum distillation.

Chemical Formula 9b

Chemical Formula 8b

Then, 25 mL of acetic acid was slowly added in a dropwise fashion to 10 g (25.6 mmol) of the compound represented by Chemical Formula 8b according to Synthesis Example 4 at 25° C. and then, heated and refluxed for 12 hours. Then, the acetic acid was vacuum distilled to obtain a compound represented by Chemical Formula 8.

25 mL of acrylic acid was slowly added in a dropwise fashion to 10 g (25.4 mmol) of the compound represented by Chemical Formula 9b at 25° C. and then, heated and refluxed at 80° C. for 6 hours. The temperature was decreased to 25° C., and then, acrylic acid was vacuum-distilled to obtain a compound represented by Chemical Formula 9.

Chemical Formula 9

Chemical Formula 8

Synthesis Example 2

20 g (51.9 mmol) of $Ph_3SnCl$ was dissolved in 70 mL of THF in a 250 mL two-necked round-bottomed flask, and the temperature was lowered to 0° C. in an ice bath. Subsequently, a 2 M isopropyl magnesium chloride (iPrMgCl) THF solution (62.3 mmol) was slowly add thereto in a dropwise fashion. When the addition in a dropwise fashion was complete, the obtained mixture was stirred at 25° C. for 12 hours to obtain a compound represented by Chemical Formula 9a.

Synthesis Example 3

20 g (51.9 mmol) of $Ph_3SnCl$ was dissolved in 70 mL of THF in a 250 mL two-necked round-bottomed flask, and the temperature was lowered to 0° C. in an ice bath. Then, 1 M neopentyl magnesium chloride THF solution (62.3 mmol) was slowly added in a dropwise fashion. When the addition in a dropwise fashion was complete, the obtained mixture was stirred at 25° C. for 12 hours to obtain a compound represented by Chemical Formula 10a.

Chemical Formula 10a

Chemical Formula 11

Then, the compound represented by Chemical Formula 10a (10 g, 24.6 mmol) was dissolved in 50 mL of $CH_2Cl_2$, and 3 equivalents (73.7 mmol) of a 2 M HCl diethyl ether solution was slowly added thereto in a dropwise fashion at −78° C. for 30 minutes. Subsequently, the obtained mixture was stirred at 25° C. for 12 hours, and then, a compound represented by Chemical Formula 10b was obtained by concentrating the solvent and performing vacuum distillation.

Chemical Formula 10b 25 mL of propionic acid was slowly added in a dropwise fashion to 10 g (23.7 mmol) of the compound represented by Chemical Formula 10b at 25° C. and then, heated and refluxed at 110° C. for 12 hours. The temperature was decreased to 25° C., and then, the propionic acid was vacuum-distilled to obtain a compound represented by Chemical Formula 10.

Chemical Formula 10

Synthesis Example 4

10 g (25.4 mmol) of the compound represented by Chemical Formula 9a was put in a 100 mL round-bottomed flask, and 25 mL of formic acid was slowly added thereto in a dropwise fashion at 25° C. and then, heated and refluxed at 100° C. for 24 hours Subsequently, the temperature was lowered to 25° C., and then, the formic acid was vacuum-distilled to obtain a compound represented by Chemical Formula 11.

Examples 1 to 32

Each of the compounds represented by Chemical Formulae 8 to 11 obtained in Synthesis Examples 1 to 4, and either citric acid (Sigma-Aldrich Corporation) or succinic acid (Sigma-Aldrich Corporation) as an organic acid were dissolved in 1-methyl-2-propyl acetate at a concentration of 3 wt % in the weight ratio shown in Tables 1 to 4, and are filtered with a 0.1 μm PTFE (polytetrafluoroethylene) syringe filter to prepare each of semiconductor photoresist compositions according to Examples 1 to 32.

A disk-shaped silicon wafer having a native-oxide surface and a 4 inch diameter is utilized as a substrate for thin film coating and treated in a UV ozone cleaning system for 10 minutes before coating the compositions. On the treated substrate, the semiconductor photoresist compositions according to Examples 1 to 32 are respectively spin-coated at 1500 rpm for 30 seconds and then, baked (baked after applied, PAB (post-apply bake)) at 100° C. for 120 seconds to form a photoresist thin films.

After the coating and the baking, the thicknesses of the films are measured through ellipsometry, which is about 27 nm.

TABLE 1

(unit: parts by weight)

| Example | 1 | 2 | 3 | 4 | 5 | 6 | 7 | 8 |
|---|---|---|---|---|---|---|---|---|
| Organometallic compound: Chemical Formula 8 | 100 | 100 | 100 | 100 | 100 | 100 | 100 | 100 |
| citric acid | 1 | 3 | 6 | 9 | | | | |
| succinic acid | | | | | 1 | 3 | 6 | 9 |

TABLE 2

(unit: parts by weight)

| Example | 9 | 10 | 11 | 12 | 13 | 14 | 15 | 16 |
|---|---|---|---|---|---|---|---|---|
| Organometallic compound: Chemical Formula 9 | 100 | 100 | 100 | 100 | 100 | 100 | 100 | 100 |
| citric acid | 1 | 3 | 6 | 9 | | | | |
| succinic acid | | | | | 1 | 3 | 6 | 9 |

TABLE 3

(unit: parts by weight)

| Example | 17 | 18 | 19 | 20 | 21 | 22 | 23 | 24 |
|---|---|---|---|---|---|---|---|---|
| Organometallic compound Chemical Formula 10 | 100 | 100 | 100 | 100 | 100 | 100 | 100 | 100 |
| citric acid | 1 | 3 | 6 | 9 | | | | |
| succinic acid | | | | | 1 | 3 | 6 | 9 |

TABLE 4

(unit: parts by weight)

| Example | 25 | 26 | 27 | 28 | 29 | 30 | 31 | 32 |
|---|---|---|---|---|---|---|---|---|
| Organometallic compound: Chemical Formula 11 | 100 | 100 | 100 | 100 | 100 | 100 | 100 | 100 |
| citric acid | 1 | 3 | 6 | 9 | | | | |
| succinic acid | | | | | 1 | 3 | 6 | 9 |

Comparative Example 1

6 parts by weight of acetic acid based on 100 parts by weight of the compound represented by Chemical Formula 8 obtained in Synthesis Example 1 was dissolved in 4-methyl-2-pentanol at a concentration of 3 wt %, and was filtered with a 0.1 μm PTFE (polytetrafluoroethylene) syringe filter to prepare a semiconductor photoresist composition according to Comparative Example 1.

In substantially the same manner as in Example 1, a photoresist thin film including the semiconductor photoresist composition according to Comparative Example 1 was prepared. After the coating and baking, the thickness of the film was about 25 nm.

Comparative Example 2

A semiconductor photoresist composition according to Comparative Example 2 and a photoresist thin film including the same were manufactured according to substantially the same method as Comparative Example 1, except that propionic acid is utilized instead of acetic acid. After the coating and baking, the thickness of the film was about 24 nm.

Comparative Example 3

A semiconductor photoresist composition according to Comparative Example 3 and a photoresist thin film including the same were manufactured according to substantially the same method as Comparative Example 1, except that cyanoacetic acid was utilized instead of acetic acid. After the coating and baking, the thickness of the film was about 23 nm.

Comparative Example 4

A semiconductor photoresist composition according to Comparative Example 4 and a photoresist thin film including the same were manufactured according to substantially the same method as Comparative Example 1, except that malonic acid was utilized instead of acetic acid. After the coating and baking, the thickness of the film was about 23 nm.

Comparative Example 5

A semiconductor photoresist composition according to Comparative Example 5 and a photoresist thin film including the same were manufactured according to substantially the same method as Comparative Example 1, except that oxalic acid was utilized instead of acetic acid. After the coating and baking, the thickness of the film was about 22 nm.

Comparative Example 6

A semiconductor photoresist composition according to Comparative Example 6 and a photoresist thin film including the same were manufactured according to substantially the same method as Comparative Example 1, except that the acetic acid (organic acid) was not utilized (e.g., was not included). After the coating and baking, the thickness of the film was about 27 nm.

Evaluation

The films according to Examples 1 to 32 and Comparative Examples 1 to 6 formed on a disk-shaped silicon wafer in the coating method were exposed to extreme ultraviolet (EUV) to form 16 nm line/space patterns with varying energies and focus. After the exposure, the films were baked at 180° C. for 120 seconds, subsequently dipped in a Petri dish containing 2-heptanone for 60 seconds and then taken out, and washed with the same solvent for 10 seconds. Finally, the films were baked at 150° C. for 5 minutes, and then pattern images thereof were obtained through SEM (scanning electron microscopy). From the SEM images, optimal or suitable energy and line edge roughness (LER) were determined, as provided in Table 5.

TABLE 5

| | Energy (mJ/cm$^2$) | LER (nm) |
|---|---|---|
| Example 1 | 300 | 1.8 |
| Example 2 | 250 | 1.8 |
| Example 3 | 200 | 1.9 |
| Example 4 | 160 | 2.0 |
| Example 5 | 310 | 1.6 |
| Example 6 | 290 | 1.8 |
| Example 7 | 250 | 1.7 |
| Example 8 | 230 | 1.9 |
| Example 9 | 260 | 1.8 |
| Example 10 | 220 | 1.8 |
| Example 11 | 180 | 1.7 |
| Example 12 | 140 | 2.0 |
| Example 13 | 280 | 1.8 |
| Example 14 | 250 | 1.8 |
| Example 15 | 230 | 1.9 |
| Example 16 | 200 | 1.8 |
| Example 17 | 270 | 1.8 |
| Example 18 | 230 | 1.8 |
| Example 19 | 180 | 2.0 |
| Example 20 | 140 | 2.2 |
| Example 21 | 280 | 1.8 |
| Example 22 | 260 | 1.6 |
| Example 23 | 230 | 1.9 |
| Example 24 | 220 | 2.0 |
| Example 25 | 280 | 1.8 |
| Example 26 | 240 | 1.9 |
| Example 27 | 180 | 1.9 |
| Example 28 | 160 | 2.0 |
| Example 29 | 290 | 1.6 |
| Example 30 | 260 | 1.6 |
| Example 31 | 250 | 1.8 |
| Example 32 | 230 | 1.9 |
| Comparative Example 1 | 360 | 1.6 |
| Comparative Example 2 | 380 | 1.7 |
| Comparative Example 3 | 160 | 5.5 |

TABLE 5-continued

| | Energy (mJ/cm²) | LER (nm) |
|---|---|---|
| Comparative Example 4 | 180 | 3.0 |
| Comparative Example 5 | Could not be developed | Could not be developed |
| Comparative Example 6 | 320 | 1.8 |

Referring to Table 5, the photoresist thin films utilizing the semiconductor photoresist compositions according to Examples 1 to 32 exhibit excellent or suitable sensitivity and line edge roughness (LER).

In contrast, the photoresist thin films according to Comparative Examples 1 to 5, which utilized semiconductor photoresist compositions including organic acids not satisfying the conditions of a vapor pressure of less than or equal to about 1.0 mmHg at 25° C. and a pKa of about 3 to about 5, and the photoresist thin films according to Comparative Example 6 including no organic acid required higher optimal energy than the photoresist thin films utilizing the semiconductor photoresist compositions according to Examples 1 to 32 or could not be developed, resulting in insufficient sensitivity or line edge roughness characteristics.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinbefore, embodiments of the present disclosure have been described and illustrated, however, it is apparent to a person with ordinary skill in the art that the present disclosure is not limited to the embodiments described, and may be variously modified and/or transformed without departing from the spirit and scope of the present disclosure. Accordingly, the modified or transformed embodiments are within the scope of technical ideas, aspects, and the claims of the present disclosure and equivalents thereof.

Description of Some of the Symbols

| | |
|---|---|
| 100: substrate | 102: thin film |
| 104: resist underlayer | 106: photoresist layer |
| 106b: exposed region | 106a: non-exposed region |
| 108: photoresist pattern | 112: organic layer pattern |
| 114: thin film pattern | |

What is claimed is:

1. A semiconductor photoresist composition, comprising:
an organometallic compound;
an organic acid having a vapor pressure of less than or equal to about 1.0 mmHg at 25° C., and a pKa of about 3 to about 5; and
a solvent,
wherein the organometallic compound is represented by Chemical Formula 1: Chemical Formula 1 and
wherein, in Chemical Formula 1,
R is a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, or a combination thereof,
X, Y, and Z are each independently —OR$^1$ or —OC(=O)R$^2$,
R$^1$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and
R$^2$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

2. The semiconductor photoresist composition of claim 1, wherein the vapor pressure is about 0.01 mmHg to about 0.5 mmHg at 25° C., and the pKa is about 3 to about 4.3.

3. The semiconductor photoresist composition of claim 1, wherein the organic acid is in an amount of about 0.1 parts by weight to about 15 parts by weight based on 100 parts by weight of the organometallic compound.

4. The semiconductor photoresist composition of claim 1, wherein the organic acid is in an amount of about 0.01 wt % to about 2 wt % based on a total mass of the semiconductor photoresist composition.

5. The semiconductor photoresist composition of claim 1, wherein:
R is a substituted or unsubstituted C1 to C8 alkyl group, a substituted or unsubstituted C3 to C8 cycloalkyl group, a substituted or unsubstituted C2 to C8 aliphatic unsaturated organic group including at least one double bond or triple bond, a substituted or unsubstituted C6 to C20 aryl group, an ethoxy group, a propoxy group, or a combination thereof, $R^1$ is a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof, and $R^2$ is hydrogen, a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof.

6. The semiconductor photoresist composition of claim 1, wherein:

R is a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, an ethoxy group, a propoxy group, or a combination thereof, $R^1$ is a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof, and $R^2$ is hydrogen, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof.

7. The semiconductor photoresist composition of claim 1, wherein the semiconductor photoresist composition further comprises an organometallic compound represented by Chemical Formula 2, an organometallic compound represented by Chemical Formula 3, or a combination thereof in addition to the organometallic compound represented by Chemical Formula 1:

Chemical Formula 2 wherein, in Chemical Formula 2,

X' is —$OR^3$ or —$OC(=O)R^4$, $R^3$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^4$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof;

Chemical Formula 3 and wherein, in Chemical Formula 3,

X" is —$OR^5$ or —$OC(=O)R^6$,

$R^5$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, $R^6$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and L is a single bond, a substituted or unsubstituted divalent C1 to C20 saturated aliphatic hydrocarbon group, a substituted or unsubstituted divalent C3 to C20 saturated or unsaturated alicyclic hydrocarbon group, a substituted or unsubstituted divalent C2 to C20 unsaturated aliphatic hydrocarbon group including at least one double bond or triple bond, a substituted or unsubstituted divalent C6 to C20 aromatic hydrocarbon group, —O—, —C(=O)—, or a combination thereof.

8. The semiconductor photoresist composition of claim 7, wherein a sum of an amount of the organometallic compound represented by Chemical Formula 2 and an amount of the organometallic compound represented by Chemical Formula 3 with respect to an amount of the organometallic compound represented by Chemical Formula 1 is in a weight ratio of about 1:1 to about 1:20.

9. The semiconductor photoresist composition of claim 1, wherein the organometallic compound represented by Chemical Formula 1 comprises a compound represented by Chemical Formula 4, a compound represented by Chemical Formula 5, a compound represented by Chemical Formula 6, a compound represented by Chemical Formula 7, or a combination thereof:

Chemical Formula 4

-continued

Chemical Formula 5

Chemical Formula 6

Chemical Formula 7 and wherein, in Chemical Formula 4 to Chemical Formula 7, R is a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, or a combination thereof, $R^a$, $R^b$, $R^c$, $R^i$, $R^k$, and $R^l$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^d$, $R^e$, $R^f$, $R^g$, $R^h$, and $R^j$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

10. The semiconductor photoresist composition of claim 1, wherein the semiconductor photoresist composition further comprises an additive comprising a surfactant, a cross-linking agent, a leveling agent, a quencher, or a combination thereof.

11. A method of forming patterns, the method comprising:
    forming an etching-objective layer on a substrate;
    coating the semiconductor photoresist composition of claim 1 on the etching-objective layer to form a photoresist layer;
    patterning the photoresist layer to form a photoresist pattern; and
    etching the etching-objective layer utilizing the photoresist pattern as an etching mask.

12. The method of claim 11, wherein the photoresist pattern is formed utilizing light having a wavelength of about 5 nm to about 150 nm.

13. The method of claim 11, further comprising forming a resist underlayer over the substrate, prior to the coating of the semiconductor photoresist composition on the etching-objective layer.

14. The method of claim 11, wherein the photoresist pattern has a width of about 5 nm to about 100 nm.

* * * * *